(12) United States Patent
Inaba et al.

(10) Patent No.: US 6,346,037 B1
(45) Date of Patent: Feb. 12, 2002

(54) WAFER POLISHING MACHINE

(75) Inventors: Takao Inaba; Minoru Numoto; Kenji Sakai, all of Mitaka (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 0 days.

(21) Appl. No.: 09/509,110

(22) PCT Filed: Oct. 15, 1999

(86) PCT No.: PCT/JP99/05716

§ 371 Date: Mar. 20, 2000

§ 102(e) Date: Mar. 20, 2000

(87) PCT Pub. No.: WO00/23229

PCT Pub. Date: Apr. 27, 2000

(30) Foreign Application Priority Data

Oct. 16, 1998 (JP) .......................................... 10-295777

(51) Int. Cl.⁷ ............................. B24B 5/00; B24B 28/00
(52) U.S. Cl. ..................................... 451/287; 451/285
(58) Field of Search ........................... 451/41, 63, 259, 451/274, 268, 269, 287, 288, 289, 397, 398, 285

(56) References Cited

U.S. PATENT DOCUMENTS

| 5,333,413 A | * | 8/1994 | Hashimoto | 451/287 |
| 5,421,768 A | * | 6/1995 | Fujiwara et al. | 451/283 |
| 5,649,854 A | | 7/1997 | Gill, Jr. | 451/290 |
| 5,679,055 A | * | 10/1997 | Greene et al. | 451/287 |
| 5,908,347 A | * | 6/1999 | Nakajima et al. | 451/287 |

FOREIGN PATENT DOCUMENTS

| EP | 0 648 575 | 4/1995 |
| JP | 07130692 | 5/1995 |
| JP | 09117857 | 5/1997 |

* cited by examiner

*Primary Examiner*—Derris H. Banks
(74) *Attorney, Agent, or Firm*—Christie, Parker & Hale, LLP

(57) ABSTRACT

A CMP machine of the invention includes first and second polishing bases 14 and 15, first and second wafer holding heads 31 and 32, a wafer loading unit 41, a wafer unloading unit 42, first and second head rotating mechanism rotating the first and second wafer holding heads so as to position then above the first and second polishing bases, wafer loading unit, or wafer unloading unit, a first transportation mechanism transporting an unpolished wafer to the wafer loading unit, and a second transportation mechanism, transporting a polished wafer from the wafer unloading unit. The first and second polishing bases are located mutually adjacently, the wafer loading unit and wafer unloading unit are located mutually adjacently, the first polishing base and wafer loading unit are located diagonally, the second polishing base and wafer unloading unit are located diagonally. Owing to this structure, transportation of a wafer to the wafer loading unit and transportation of a wafer from the wafer unloading unit are achieved by the different transportation mechanisms. This leads to a minimized adhesion of dust to an unpolished wafer.

2 Claims, 4 Drawing Sheets

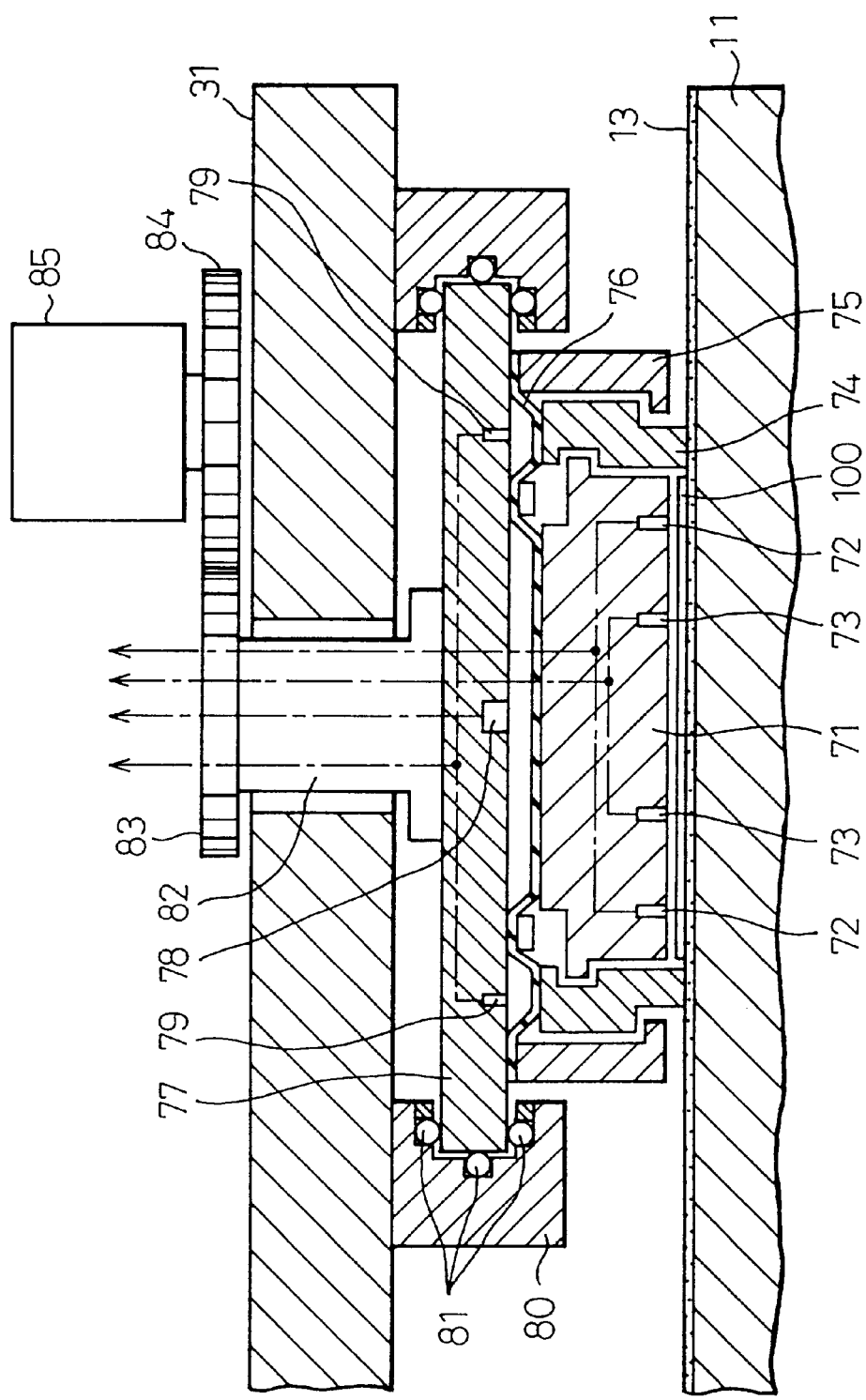

WAFER POLISHING MACHINE

TECHNICAL FIELD

The present invention relates to a wafer polishing machine. More particularly, this invention is concerned with a wafer polishing machine adopting a chemomechanical polishing (CMP) process effective in flattening the surface of a wafer in the course of drawing IC patterns on the wafer.

BACKGROUND ART

Microscopic machining of ICs has been facilitated in recent years. IC patterns are drawn on many layers. It is therefore unavoidable that some irregularity occurs on the surfaces of the patterned layers. Conventionally, even when such irregularity occurs on one layer, a subsequent layer is patterned with the irregularity left intact. As the number of layers increases, the widths of lines or the diameters of holes diminish. This makes it hard to draw fine patterns. Defect can occur frequently. For this reason, after the surface of a patterned layer is polished to be flat, the next layer is patterned. Moreover, after holes are bored, a metallic layer for linking layers is formed by performing plating or the like. The metallic layer on the surface of the patterned layer is abraded so that the metallic layer will be left only in the holes. A wafer polishing machine (CMP machine) adopting the CMP process is used to polish wafers in the course of drawing IC patterns.

FIG. 1A and FIG. 1B are explanatory diagrams concerning machining to be performed according to the CMP process in the course of manufacturing ICs. FIG. 1A shows polishing of the surface of an interlayer dielectric to be performed so that the surface thereof will become flat. FIG. 1B shows abrasion of the surface thereof to be performed so that a metallic layer will be left in holes alone. As shown in FIG. 1A, after a pattern 2 is drawn on a substrate 1 by forming a metallic layer or the like thereon, when a dielectric interlayer 3 is formed, the pattern portion of the dielectric interlayer becomes higher than the other portion thereof. This results in an irregular surface. A CMP machine is then used to polish the surface. The surface is thus brought to the state shown in the right side of FIG. 1A. Thereafter, the next pattern is drawn. For forming a metallic layer linking layers, as shown in FIG. 1B, connection holes are bored in the lower layer having the pattern 2 drawn thereon, and a metallic layer 4 is formed by performing plating or the like. Thereafter, the CMP machine is used to fully abrade the superficial metallic layer 4.

FIG. 2 shows the basic structure of the CMP machine. As illustrated, the CMP machine has a polishing base 11 and a wafer holding head 21. An elastic polishing cloth 13 is bonded to the surface of the polishing base 11. The polishing base 11 rotates with an axis of rotation 12 as a center. Slurry that is an abrasive is supplied to the polishing cloth 4 on the rotating polishing base 1 through a nozzle that is not shown. The wafer holding head 21 holds a wafer 100 to be polished, presses the wafer against the polishing cloth 13 with a predetermined pressure, and rotates with the axis of rotation 22 as a center. The surface of the held wafer is thus polished. A groove is generally formed in the polishing cloth 13 in order to facilitate supply of slurry to the contact surface of the polishing cloth coming into contact with a wafer. In the drawing, the number of wafer holding heads 21 is one. In this case, the right side of the polishing base 1 is left unused, and production efficiency is unsatisfactory. Generally, a plurality of wafer holding heads 21, for example, two or four wafer holding heads 21 are included in order to concurrently polish a plurality of wafers.

When the CMP machine is used for polishing, the wafer 100 is first aligned and transported to a loader. The wafer holding head 21 holds the wafer placed on the loader using a suction mechanism, moves it to the polishing base 11, and presses it against the polishing base 11. The wafer is thus polished. When polishing is completed, the wafer holding head 21 holds the wafer using the suction mechanism and transports it to an unloader. Slurry that is an abrasive is adhering to the wafer 100 transported to the unloader. After the wafer is washed using a washer, it is dried. The wafer is then transported to a wafer collector such as a cassette. After the wafer is polished, IC patterns are drawn on the wafer according to a lithography method or the like. If abrasive particles or leavings were left intact, it would cause a defective IC pattern. Washing must therefore be carried out in order to make a wafer very clean. A washed wafer must be handled carefully for fear dust or the like may adhere to the wafer.

The CMP machine is required to meet such requirements that the performance in polishing must be high enough to ensure high-precision polishing, processing efficiency expressed as a throughput must be excellent, and an area needed for installation must be small. To meet the requirements, a plurality of polishing bases is included, and a wafer loading unit and a wafer unloading unit are used in common among the polishing bases. The wafer loading unit supplies wafers to the plurality of polishing bases. The wafer unloading unit transports wafers from the plurality of polishing bases. When this configuration is adopted, since one wafer loading unit and one wafer unloading unit are included relative to a plurality of polishing bases, the area needed for installation can be made smaller. Moreover, the time required for transporting wafers from the wafer loading unit to the polishing base or the time required for transporting wafers from the polishing base to the wafer unloading unit is shorter than the time required for polishing. Even when the above configuration is adopted, the processing efficiency will not deteriorate. Furthermore, polishing a wafer may be achieved by combining rough polishing and fine polishing. The rough polishing is performed at a high polishing speed but is insufficient in precision. The fine polishing is performed at a low polishing speed but ensures high precision. When the above configuration is adopted, one of the plurality of polishing bases may be used to perform close polishing, and the other polishing bases may be used to perform rough polishing.

The CMP machine having a plurality of polishing bases includes the wafer loading unit and wafer unloading unit. Nevertheless, the same transportation mechanism is used to transport wafers to the wafer loading unit and to transport wafers from the wafer unloading unit. Therefore, dust such as abrasive particles or leavings adheres to the transportation mechanism that has transported polished wafers. This kind of dust adheres to wafers that have not been polished and are transported to the wafer loading unit. The dust adhering to the polished surfaces of wafers does not pose a severe problem. However, the dust adhering to the backs of the wafers poses a problem in that a polishing pressure becomes inhomogeneous. This leads to deteriorated performance in polishing.

DISCLOSURE OF THE INVENTION

The present invention attempts to solve the above problems. An object of the present invention is to provide a CMP machine having a plurality of polishing bases, and a wafer loading unit and wafer unloading unit that are used in common among the plurality of polishing bases. The wafer loading unit supplies wafers to the plurality of polishing bases. The wafer unloading unit transports wafers from the plurality of polishing bases. In the CMP machine, the components are laid out so that adhesion of dust to unpolished wafers can be minimized.

To accomplish the above object, a CMP machine in accordance with the present invention has two polishing bases located mutually adjacently. Moreover, a wafer loading unit and wafer unloading unit are located mutually adjacently. A first polishing base and the wafer loading unit are located diagonally. A second polishing base and the wafer unloading unit are located diagonally. Transportation of a wafer to the wafer loading unit and transportation of a wafer from the wafer unloading unit are achieved using different systems.

To be more specific, a CMP machine in accordance with the present invention consists of first and second polishing bases, first and second wafer holding heads, a wafer loading unit, a wafer unloading unit, a first head rotating mechanism, a second head rotating mechanism, a first transportation mechanism, and a second transportation mechanism. The first and second polishing bases each have a polishing cloth attached to the surface thereof, and rotate the polishing cloth thereof. The first and second wafer holding heads each hold wafers and rotate while pressing the surfaces of the wafers against the polishing cloth. Unpolished wafers are placed on the wafer loading unit. Polished wafers are placed on the wafer loading unit. The first head rotating mechanism rotates the first wafer holding head so as to position it above the first polishing base, wafer loading unit, or wafer unloading unit. The second head rotating mechanism rotates the second wafer holding head so as to position it above the second polishing base, wafer loading unit, or wafer unloading unit. The first transportation mechanism transports an unpolished wafer to the wafer loading unit. The second transportation mechanism transports a polished wafer from the wafer unloading unit. The first and second polishing bases are located mutually adjacently. The wafer loading unit and wafer unloading unit are located mutually adjacently. The first polishing base and wafer loading unit are located diagonally. The second polishing base and wafer unloading unit are located diagonally.

According to the present invention, the first transportation mechanism and second transportation mechanism are included so that transportation of wafers to the wafer loading unit and transportation of wafers from the wafer unloading unit can be achieved using the different transportation mechanisms. Adhesion of dust to unpolished wafers can therefore be minimized.

The first and second wafer holding heads are designed to be able to rotate mutually independently while holding two respective wafers. The surfaces of the polishing bases can thus be used effectively.

One of the two polishing bases may be used for rough polishing, and the other polishing base may be used for fine polishing.

A mechanism for rotating the wafer loading unit and wafer unloading unit or moving them parallel to each other so as to shift them may conceivably be included. Using the mechanism, either the wafer loading unit or wafer unloading unit is selectively moved to a position at which wafers are received from or output to the wafer holding head. Consequently, the mechanism makes it possible to switch the wafer loading unit and wafer unloading unit, and to receive or output wafers at the same position. When the mechanism is utilized, three polishing bases may be included and assigned to rough polishing and fine polishing. Two polishing bases are assigned to polishing requiring a long processing time. This may lead to an improved throughput. However, according to this configuration, the first and second transportation mechanisms must access the common position, at which wafers are received from or output to the wafer loading unit or wafer unloading unit, from different directions. A component for aligning unpolished wafers and a component for washing polished wafers must be located in different directions. This leads to an increase in the area required for installing the CMP machine. In particular, a bay through which wafers are moved in or out of the CMP machine must be widened. This is not preferable in constructing an automated manufacturing process.

BRIEF DESCRIPTION OF THE DRAWINGS

FIG. 4 shows the structure of a wafer holding head in accordance with the embodiment.

BEST MODE FOR CARRYING OUT THE INVENTION

Figure 1A:
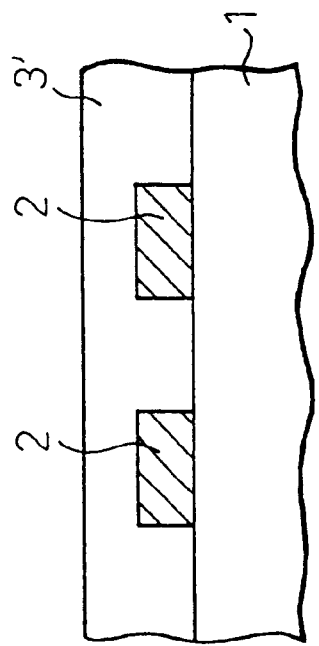
FIG. 1A and FIG. 1B are explanatory diagrams concerning processing to be performed according to a CMP process.
Figure 1A:
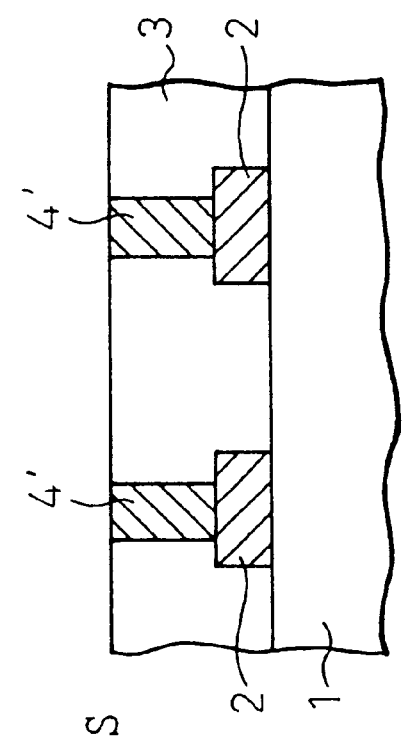
Figure 1B:
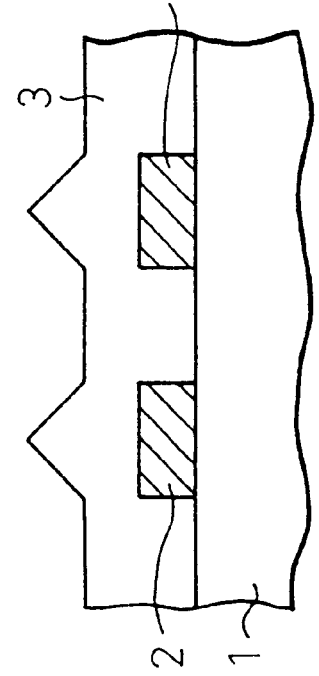
Figure 1B:
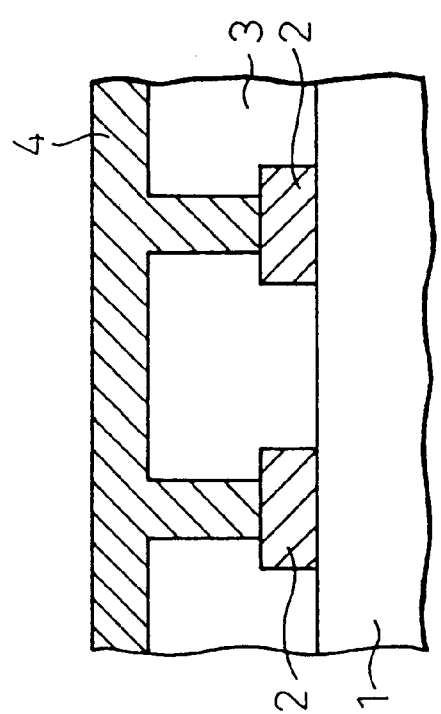
Figure 2:
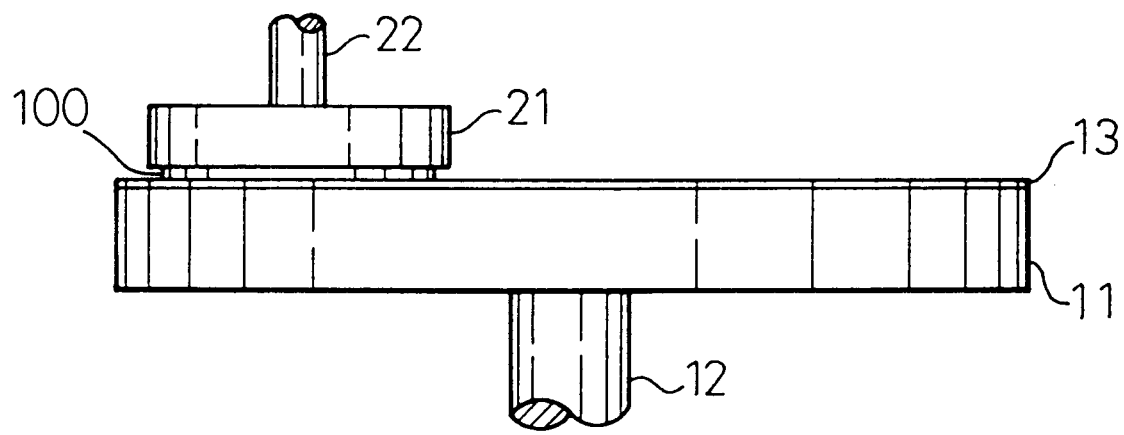
FIG. 2 shows the basic structure of a CMP machine.
Figure 3:
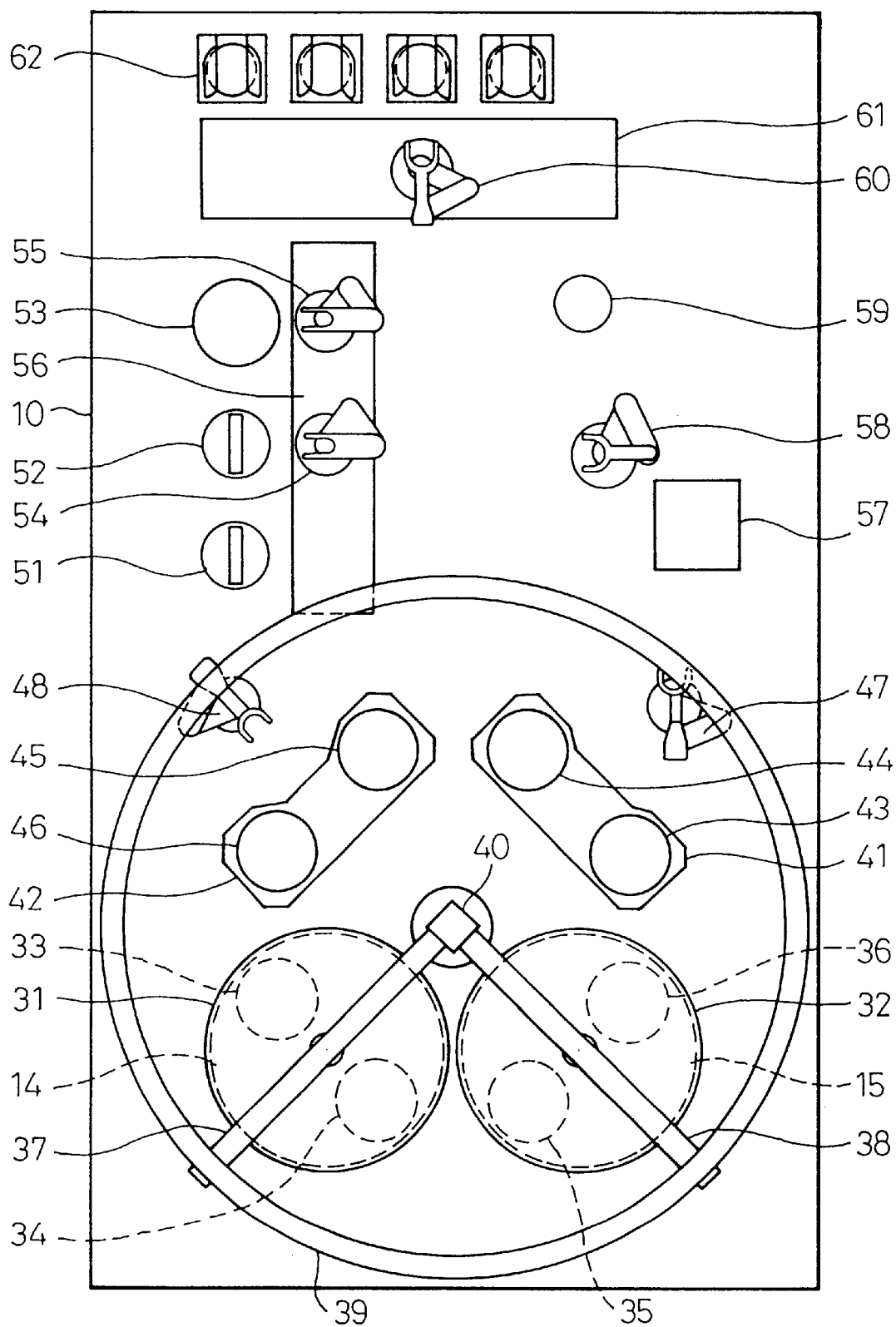
FIG. 3 shows the layout of components of a CMP machine in accordance with an embodiment of the present invention.

FIG. 3 is a top view showing the layout of components of a CMP machine in accordance with an embodiment of the present invention. As illustrated, two polishing bases 14 and 15 are included. Two wafer holding heads 31 and 32 each holding wafers and pressing them against an associated polishing base are placed above the two polishing bases. The wafer holding heads 31 and 32 include wafer holding and rotating mechanisms 33, 34, 35, and 36. Each wafer holding and rotating mechanism sucks and holds a wafer. For polishing, each wafer holding and rotating mechanism pneumatically presses a wafer against a polishing cloth placed on the polishing base 14 or 15. The wafer holding heads 31 and 32 are hung on rotation bars 37 and 38 each having one end thereof supported by an axis of rotation 40 and the other end thereof supported by an annular guide 39. The wafer holding heads 31 and 32 can thus move over a wafer loading unit 41 and a wafer unloading unit 42.

Unpolished wafers stowed in a plurality of wafer cassettes 62 are picked up by a transportation arm 60 supported to be able to move on a moving mechanism 61, and then placed on a relay base 59. A transportation arm 58 transports the wafer to a thickness measuring instrument 57 for measuring and checking the thickness of a layer, to be polished, of the wafer placed on the relay base 59. Wafers whose layer thicknesses have been checked are placed on receiver members 43 and 44 on the wafer loading unit 41 by the transportation arm 58.

Each of polished wafers placed on receiver members 45 and 46 on the wafer unloading unit 42 is placed on a first washer 51 by a transportation arm 48. The wafer washed by the first washer 51 is placed on an adjoining second washer 52. Washing a polished wafer is achieved by following two steps. The transportation arm 48 transports a wafer that has just been polished, and is therefore smeared. The transportation arm 54 transports a wafer that has undergone the first-step washing, and is therefore not smeared so much as a wafer on the transportation arm 48. A wafer having undergone the second-step washing in the second washer 52 is placed on a drier 53 by a transportation arm 55 and then dried. The transportation arms 54 and 55 are supported to be movable on a moving mechanism 56. The wafer having undergone the second-step washing is less dirty than a wafer having undergone the first-step washing. The transportation arm 55 is therefore included separately from the transportation arm 54 for transporting a wafer having undergone the first-step washing. A wafer dried by the drier 53 is returned to the wafer cassette 62 by the transportation arm 60.

Polishing is performed in a time lag of a half cycle between two polishing bases 14 and 15. While the polishing bases 14 and 15 are used for polishing, wafers whose layer thicknesses have been checked are placed on the receiver members 43 and 44 on the wafer loading unit 41. When polishing using the polishing base 14 is completed, the wafer holding head 31 holds the wafers in the wafer holding and rotating mechanisms 33 and 34, and moves clockwise to above the wafer unloading unit 42. The wafer holding head 31 then places the polished wafers on the receiver members 45 and 46. The wafer holding head 31 then moves to above the wafer loading unit 41 and sucks unpolished wafers placed on the receiver members 43 and 44 into the wafer holding and rotating mechanisms 33 and 34. Meanwhile, the transportation arm 48 transports the polished wafer from the receiver member 45 into the first washer 51. The wafer holding head 31 holds the unpolished wafers and moves to above the polishing base 14, whereby polishing is started. In the meantime, unpolished wafers are placed on the receiver members 43 and 44 on the wafer loading unit 41. The wafer having been washed in the first washer 51 is moved to the second washer 52. Concurrently, the transportation arm 48 transports the polished wafer from the receiver member 46 to the first washer 51.

Thereafter, when polishing using the polishing base 14 is completed, the wafer holding head 32 holds the wafers in the wafer holding and rotating mechanisms 35 and 36 and moves counterclockwise to above the wafer unloading unit 42. The wafer holding head 32 then places the polished wafers on the receiver members 45 and 46. Thereafter, the wafer holding head 32 moves to above the wafer loading unit 41, and sucks unpolished wafers placed on the receiver members 43 and 44 into the wafer holding and rotating mechanisms 33 and 34. The other movements are identical to those mentioned above.

The polishing bases 14 and 15 and the wafer holding and rotating mechanisms 33, 34, 35, and 36 of the wafer holding heads 31 and 32 may have the same structures as conventionally employed ones. Herein, the wafer holding and rotating mechanisms are each structured to press a wafer against a polishing cloth using a predetermined pneumatically induced pressure. FIG. 4 shows the structure of the wafer holding and rotating mechanism 33 of the wafer holding head 31.

As illustrated, the wafer holding and rotating mechanism 33 includes a carrier member 71, a polished surface adjustment ring 74, a guide ring 75, a rotary substrate 77, a rotary guide plate 80, an axis of rotation 82, gears 83 and 84, and a motor 85. The axis of rotation 82 has a slip ring. The carrier member 71 has air ports 72 through which air is jetted out and suction ports 73 through which a negative pressure is applied. A wafer 100 is pressed against a polishing cloth 13 using the pressure of the air jetted out of the air ports 72. A negative pressure is then applied through the suction ports 73, whereby the wafer 100 is sucked and held on to the carrier member 71. The polished surface adjustment ring 74 comes into contact with the polishing cloth 13 with a predetermined pressure, and thus homogenizes the state of the inner polishing cloth 13 so as to prevent irregular polishing. Moreover, when the wafer holding head 31 moves upward, the polished surface adjustment ring 74 holds the carrier member 71. For pressing the wafer 100 against the polishing cloth 13, the polished surface adjustment ring 74 and the carrier member 71 are not mutually restricted. When the wafer holding head 31 moves upwards, the guide ring 75 holds the polished surface adjustment ring 74. For pressing the wafer 100 against the polishing cloth 13, the guide ring 75 and polished surface adjustment ring 74 are not mutually restricted.

A rubber seat 76 is placed between the rotary substrate 77, carrier member 71, an polished surface adjustment ring 74. A predetermined air pressure is applied through an air port 78, whereby the carrier member 71 is pressed down with a predetermined pressure. A predetermined air pressure is applied through air ports 79, whereby the polished surface adjustment ring 74 is pressed down with a predetermined pressure. When the carrier member 71 is pressed down with an air pressure applied through the air port 78, the gap between the carrier member 71 and wafer 100 varies. Thus, although the pressure of air jetted out through the air ports 72 remains unchanged, the pressure with which the wafer 100 is pressed against the polishing cloth 13 can be varied.

The rotary substrate 77 is held by the rotary guide plate 80 via bearings 81 so that the rotary substrate can rotate. When a motor 85 is rotated, the rotary substrate 77 is rotated via the gear 84 and the gear 83 formed on the axis of rotation 82.

The wafer holding and rotating mechanisms 34, 35, and 36 have the same structure as that mentioned above.

As mentioned above, the CMP machine requires a measuring instrument for measuring the thickness of a layer of an unpolished wafer, a washer for washing a polished wafer, and a drier for drying the washed wafer. When a plurality of polishing bases is included in order to improve a throughput offered by the machine, it is necessary to prevent deterioration of polishing precision caused by dust such as abrasive particles or leavings adhering to the back of an unpolished wafer. Moreover, an area needed for installation must be taken into consideration. Especially in an automated CMP line, the dimensions of a bay required for supplying and collecting unpolished wafers and polished wafers must be taken into consideration. It is therefore preferred that the wafer loading unit 41 and wafer unloading unit 42 are, as they are in this embodiment, positioned separately from the two polishing bases. Namely, it is preferred that a supply route along which unpolished wafers are supplied and a collection route along which polished wafers are collected are defined mutually independently.

For example, for improving a throughput offered by a CMP machine capable of carrying out rough polishing and fine polishing, another polishing base may be positioned at the wafer unloading unit 42 and a total of three polishing bases may be used for rough polishing and fine polishing. Two of the polishing bases may be used for polishing requiring a long processing time. In this case, four receiver members including two loading receiver members and two unloading receiver members are formed in a wafer transfer unit. Any two of the four receiver members can be selected by rotating the wafer transfer unit or moving it parallel. Thus, the loading receiver members and unloading receiver members can be used independently. By adopting this structure, it can be prevented that polishing precision deteriorates due to dust such as abrasive particles or leavings adhering to the back of an unpolished wafer. However, even in this case, separate transportation arms are needed to transport wafers to the loading receiver members and unloading receiver members respectively. The transportation arms must therefore be located so that they will access the receiver members from different directions. Accordingly, the associated layer thickness measuring instrument and washer must be positioned in different directions. This leads to a wide bay. Besides, this structure is effective only when the time required for rough polishing is different from the time required for fine polishing to such an extent that one time is twice as long as the other. As far as the times required for rough polishing and fine polishing are almost the same, the adoption of the structure does not lead to an improved throughput. Incidentally, in the present embodiment, the times required for rough polishing and fine polishing are the same. In this case, the layout of components in accordance with the present invention is preferable.

INDUSTRIAL APPLICABILITY

According to the present invention, a CMP machine to be run automatically can offer a high throughput and ensure high polishing precision. Moreover, a layout of components requiring a small area for installation, or especially, a small bay can be realized.

What is claimed is:

1. A wafer polishing machine, comprising:

first and second polishing bases each having a polishing cloth attached to the surface thereof and rotating the polishing cloth;

first and second wafer holding heads each holding wafers and rotating while pressing the surfaces of the wafers against said polishing cloth;

a wafer loading unit on which unpolished wafers are placed;

a wafer unloading unit on which polished wafers are placed;

a first head rotating mechanism for rotating said first wafer holding head so as to position it above said first polishing base, wafer loading unit, or wafer unloading unit;

a second head rotating mechanism for rotating said second wafer holding head so as to position it above said second polishing base, wafer loading unit, or wafer unloading unit;

a first transportation mechanism for transporting an unpolished wafer to said wafer loading unit; and a second transportation mechanism for transporting a polished wafer from said wafer unloading unit, wherein the first transportation mechanism and the second transportation mechanism are different, wherein said first and second polishing bases are located mutually adjacently, said wafer loading unit and wafer unloading unit are located mutually adjacently, said first polishing base and wafer loading unit are located diagonally, and said second polishing base and wafer unloading unit are located diagonally.

2. A wafer polishing machine according to claim 1, wherein said first and second wafer holding heads can mutually independently rotate while holding two respective wafers.

* * * * *